(12) United States Patent
Dash et al.

(10) Patent No.: US 8,054,057 B2
(45) Date of Patent: Nov. 8, 2011

(54) LOW DROPOUT REGULATOR TESTING SYSTEM AND DEVICE

(75) Inventors: Ranjit Kumar Dash, Karnataka (IN); Harikrishna Parthasarathy, Tamil Nadu (IN)

(73) Assignee: Texas Instruments Incorporated, Dallas, TX (US)

( * ) Notice: Subject to any disclaimer, the term of this patent is extended or adjusted under 35 U.S.C. 154(b) by 758 days.

(21) Appl. No.: 12/121,800

(22) Filed: May 16, 2008

(65) Prior Publication Data

US 2009/0284246 A1 Nov. 19, 2009

(51) Int. Cl.
*G05F 1/40* (2006.01)
(52) U.S. Cl. ........................................................ 323/282
(58) Field of Classification Search .................. 323/265, 323/273, 276, 282, 351; 324/537, 750
See application file for complete search history.

(56) References Cited

U.S. PATENT DOCUMENTS

| 7,545,161 B2 * | 6/2009 | Hsu et al. .................. 324/750.3 |
| 2009/0085610 A1 * | 4/2009 | Westwick ...................... 327/68 |

* cited by examiner

*Primary Examiner* — Adolf Berhane
(74) *Attorney, Agent, or Firm* — Wade J. Brady, III; Frederick J. Telecky, Jr.

(57) ABSTRACT

A device for testing low dropout (LDO) regulator is disclosed. In one embodiment, a device for testing LDO regulators includes an absolute value measurement module for measuring absolute output voltages of the LDO regulators including a resistor scaling array for generating candidate voltages based on a first output voltage of the LDO regulators, a multiplexer for forwarding one of the candidate voltages selected by a binary search algorithm, and a comparator for generating a first test output by comparing the candidate voltage with an external reference voltage, and a DC load regulation measurement module for measuring corresponding DC regulation voltages of the LDO regulators including a switch for applying an internal test load to a second output voltage of the LDO regulators, and the comparator for generating a second test output by comparing a reference voltage with the second output voltage modified by the internal test load.

20 Claims, 6 Drawing Sheets

SYSTEM FOR TESTING LDOs 400

US 8,054,057 B2

LOW DROPOUT REGULATOR TESTING SYSTEM AND DEVICE

FIELD OF TECHNOLOGY

Embodiments of the present invention relate to the field of electronics. More particularly, embodiments of the present invention relate to measurement systems, devices and circuits for low dropout (LDO) regulator output.

BACKGROUND

A low dropout (LDO) regulator is a DC linear voltage regulator, and it is used to maintain a constant voltage in several electronic devices. For example, multiple LDO regulators are present in a system on chip (SOC) environment. Each IP block and/or individual function of the SOC may have a dedicated reference voltage generator, which generates a bandgap reference voltage, and a constant voltage output from the dedicated reference voltage generator is maintained by one or more LDO regulators. Furthermore, the number of LDO regulators in the SOC may increase rapidly due to popularity of new capless LDO regulators and high demand for block to block noise isolation in the SOC.

Currently, the LDO regulator is being tested using one of two known methods. First, as illustrated in FIG. 1, a conventional non-BIST scheme uses a test device 112 such as a voltmeter to measure LDO regulator outputs present in each IP block through a test port 110 (e.g., an external pin of a SOC 102). Accordingly, this scheme may require several external ports to measure the LDO regulators (e.g., LDO 104A through LDO 104N) present in the IP blocks of the SOC 102. During the process, outputs (e.g., V 106A through V 106N) from the LDO regulators are multiplexed using an M-to-1 MUX 108 and forwarded to the test device 112 through the test port 110. As a result, it may be time consuming for the test device 112 to obtain data through the test port 110 which often employs joint test action group (JTAG) interface.

FIG. 2 illustrates a conventional BIST scheme to test LDO regulators 224 present in an SOC 202. There may be several BIST circuits including a BIST circuit 204A in the SOC 202 connected to a test device 206 through at least two test ports (e.g., a test port 212 and a test port 214). A calibration signal (e.g., $V_{CAL}$ 210) from the test device 206 is used to calibrate the BIST circuit 204A. The BIST circuit 204A may generate a test output 228 by comparing an external reference voltage (e.g., $V_{REF}$ 208) with an output of the LDO regulator 224 using a comparator based on a PMOS 216 and an NMOS 218. The output of the comparator is processed through a buffer 226 to synchronize the test output 228 with other test outputs.

As illustrated in FIG. 2, the conventional BIST scheme requires two test ports (e.g., the test port 212 and the test port 214) to convey two external signals (e.g., $V_{REF}$ 208 and $V_{CAL}$ 210) from the test device 206 to the gate of the PMOS 216 and to the gate of the NMOS 218, respectively. Accordingly, two external pins of the SOC 202 may have to be allocated. In addition, the BIST circuit 204A may require calibration to eliminate non-linearity in the design of the BIST circuit 204A. The extra calibration step may prolong the process of testing LDO regulators 224. For example, it may take approximately 48 ms to complete testing using the conventional BIST scheme of FIG. 2 equipped with 1 MHz clock. Furthermore, the conventional BIST scheme is able to measure only absolute value measurement of outputs of the LDO regulators 224, but does not address the need to perform DC load regulation measurement.

SUMMARY

A low dropout (LDO) regulator testing system and device is disclosed. In one aspect, a system for testing LDO regulators includes a resistor scaling array for generating multiple candidate voltages based on an output voltage (e.g., ranging between 1.2 volts and 1.4 volts) of the LDO regulators, a multiplexer for forwarding one of the candidate voltages based on a select signal from a search module (e.g., which is based on a binary search algorithm), and a comparator for generating a test output by comparing the one of the plurality of candidate voltages with an external reference voltage (e.g., which is forwarded from an external test device). For example, the external reference voltage is approximately 0.7 volt.

The system also includes another multiplexer for forwarding the output voltage of the LDO regulators by multiplexing respective output voltages of the LDO regulators. Further, test output generated is a logical zero if the one of the candidate voltages is greater than the external reference voltage. In addition, the candidate voltage corresponding to the logical zero is decoded to obtain a value of the output voltage of the LDO regulators. The value of the output voltage of the LDO regulators is stored in a register to be read out by the external test device. Also, the value of the output voltage of the LDO regulators is an absolute value measurement of the output voltage of the LDO regulators.

In another aspect, a system for testing LDO regulators includes a switch for applying an internal test load to an output voltage (e.g., ranging between 1.2 volts and 1.4 volts) of the LDO regulators, and a comparator for generating a test output by comparing a reference voltage with the output voltage of the LDO regulators modified by the internal test load. The reference voltage is equivalent to a bandgap reference voltage associated with the LDO regulators reduced by a threshold voltage. The system further includes a multiplexer for forwarding the output voltage of the LDO regulators by multiplexing respective output voltages of the LDO regulators. The test output generated is a logical zero if the output voltage of the LDO regulators modified by the internal test load is greater than the reference voltage. The logical zero indicates that a DC load regulation measurement of a LDO regulator corresponding to the output voltage is within the threshold voltage.

In yet another aspect, a device for testing LDO regulators includes an absolute value measurement module for measuring absolute output voltages of the LDO regulators, the module includes a resistor scaling array for generating multiple candidate voltages based on a first output voltage of the LDO regulators, a multiplexer for forwarding one of the candidate voltages selected by a binary search algorithm, and a first comparator for generating a first test output by comparing the one of the candidate voltages with an external reference voltage, and a DC load regulation measurement module for measuring corresponding DC regulation voltages of the LDO regulators, the module includes a switch for applying an internal test load to a second output voltage of the LDO regulators, and a second comparator for generating a second test output by comparing a reference voltage with the second output voltage modified by the internal test load.

The first comparator and the second comparator may be implemented using a single comparator in a sequential manner. The device further includes a digital configuration circuit for setting a test mode for the absolute value measurement module or the DC load regulation measurement module. The test mode is triggered by a signal from an external test device.

The methods, systems, and apparatuses disclosed herein may be implemented in any means for achieving various aspects, and may be executed in a form of a machine-readable medium embodying a set of instructions that, when executed by a machine, cause the machine to perform any of the operations disclosed herein. Other features will be apparent from the accompanying drawings and from the detailed description that follows.

BRIEF DESCRIPTION OF THE DRAWINGS

Example embodiments are illustrated by way of example and not limitation in the figures of the accompanying drawings, in which like references indicate similar elements and in which.

Other features of the present embodiments will be apparent from the accompanying drawings and from the detailed description that follows.

DETAILED DESCRIPTION

A system and device for testing low dropout regulator (LDO) is disclosed. In the following detailed description of the embodiments of the invention, reference is made to the accompanying drawings that form a part hereof, and in which are shown by way of illustration specific embodiments in which the invention may be practiced. These embodiments are described in sufficient detail to enable those skilled in the art to practice the invention, and it is to be understood that other embodiments may be utilized and that changes may be made without departing from the scope of the present invention. The following detailed description is, therefore, not to be taken in a limiting sense, and the scope of the present invention is defined only by the appended claims.

Figure 1:
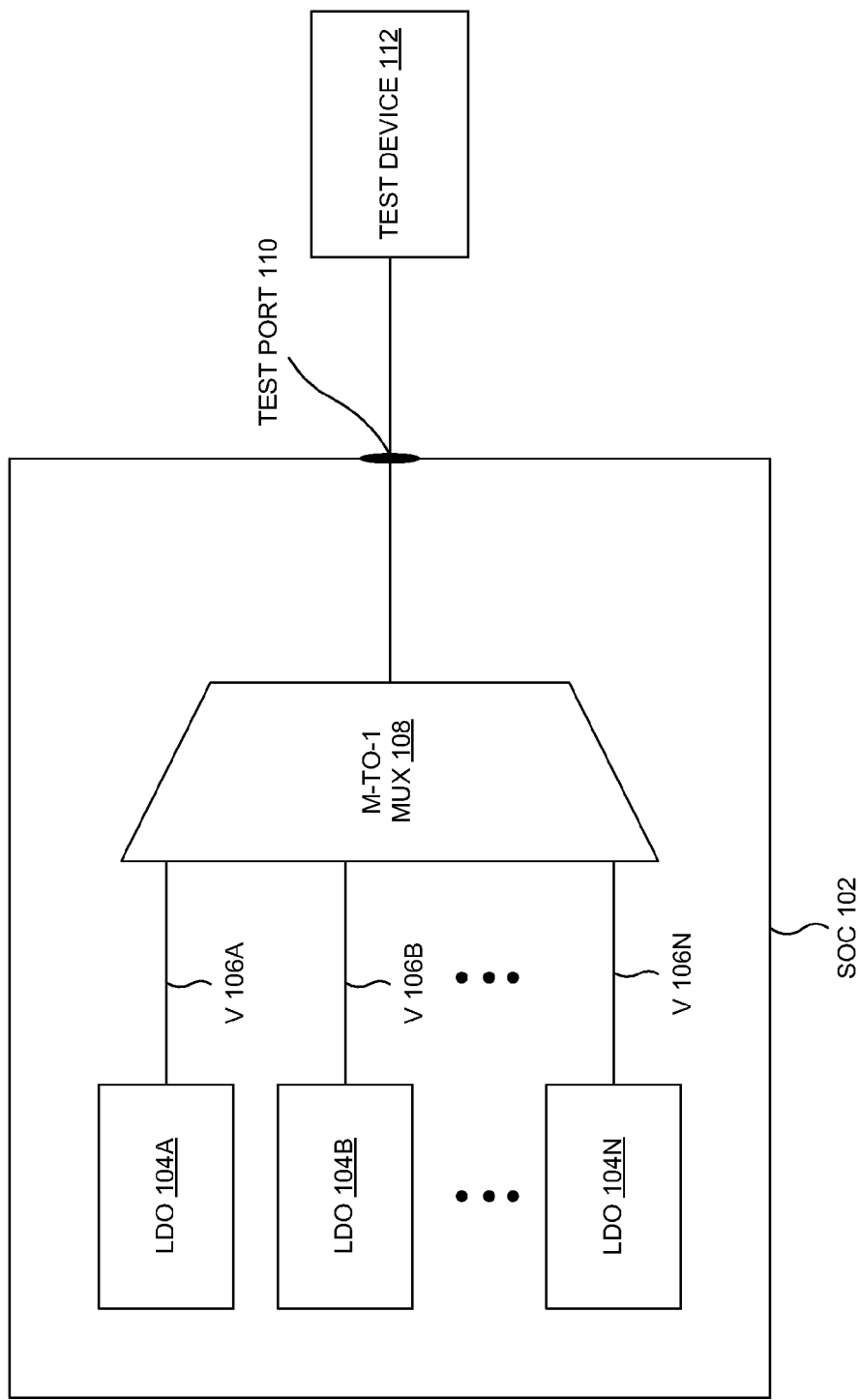
FIG. 1 is block diagram illustrating a non-BIST scheme for measuring low dropout (LDO) regulator outputs in a system on chip (SOC).
Figure 2:
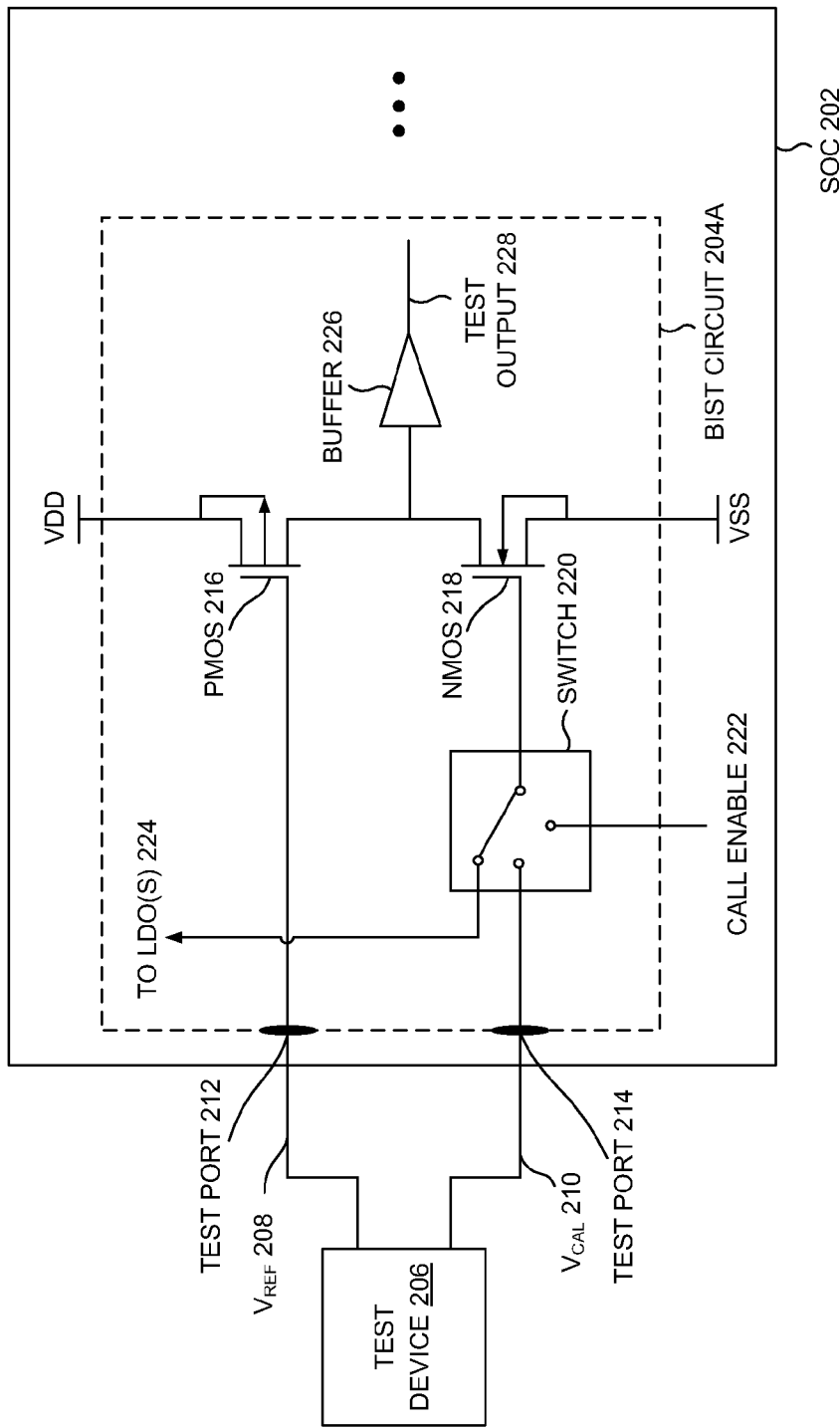
FIG. 2 is a schematic diagram illustrating a BIST scheme for testing LDO regulators present in a SOC.
Figure 3:
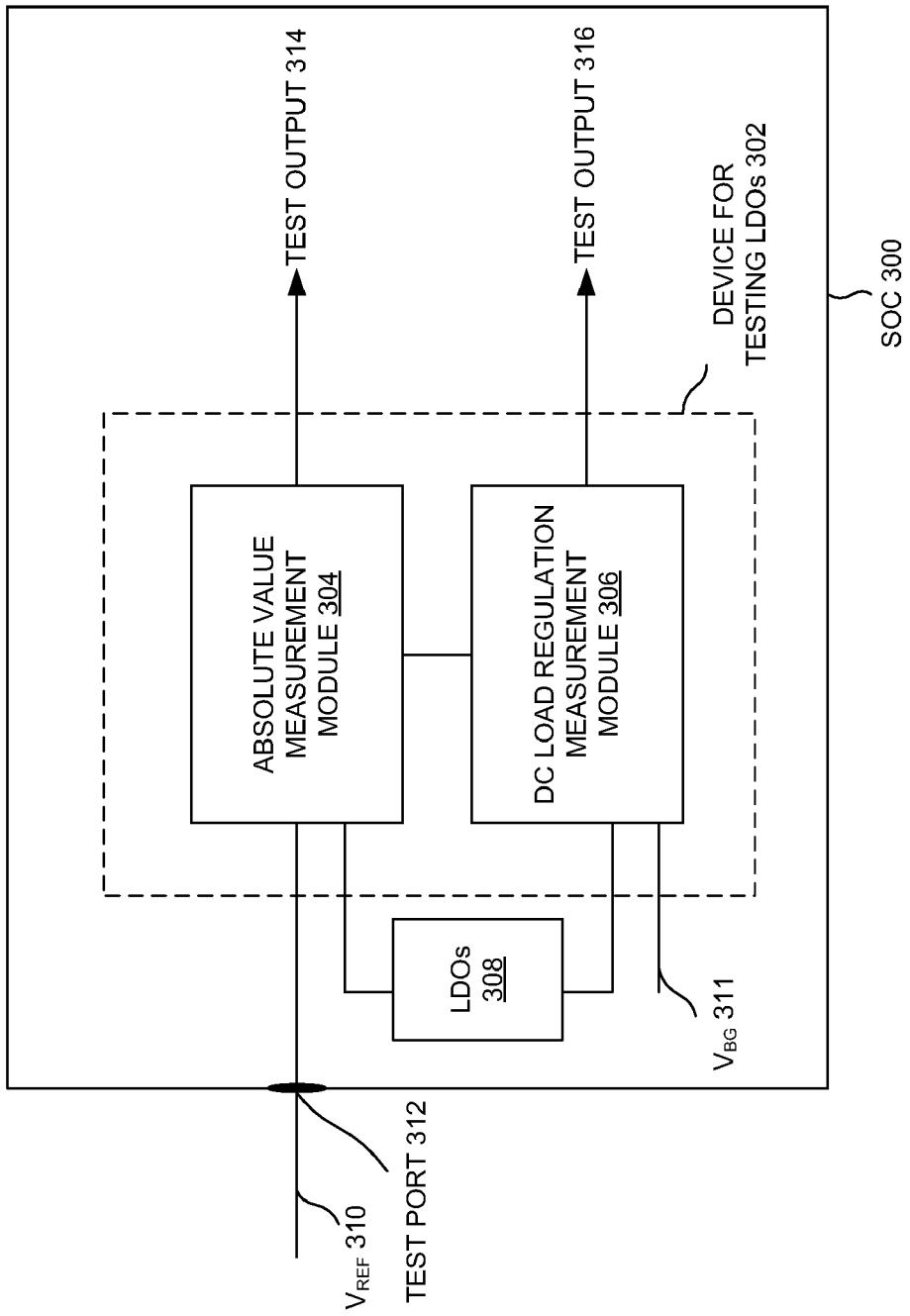
FIG. 3 is a block diagram for an exemplary device for testing LDO regulators, according to one embodiment.

FIG. 3 is a block diagram for an exemplary device for testing LDO regulators 302, according to one embodiment. As illustrated in FIG. 3, the device 302 includes an absolute value measurement module 304 for measuring absolute output voltages of LDO regulators (LDOs) 308 and a DC load regulation measurement module 306 for measuring corresponding DC regulation voltages of the LDO regulators 308. It is appreciated that the device for testing LDO regulators 302 can comprise one or both of the absolute value measurement module 304 and the DC load regulation measurement module 306. Also, FIG. 3 illustrates an external reference voltage $V_{REF}$ 310 applied to the absolute value measurement module 304, a bandgap voltage $V_{BG}$ 311 applied to the DC load regulation measurement module 306 as the reference voltage, a test port 312, a test output 314 of the absolute value measurement module 304, and a test output 316 of the DC load regulation measurement module 306.

In one embodiment, the device for testing LDO regulators 302 is connected to an external test device through the test port 312. In one embodiment, the device 302 comprises a digital configuration circuit for setting a test mode for the absolute value measurement module 304 and/or the DC load regulation measurement module 306. In one exemplary implementation, the test mode can be triggered by a signal from the external test device (e.g., automated test equipment (ATE)). In one exemplary embodiment, the device 302 for testing LDO regulators 308 is implemented as a built-in self-test (BIST) circuit. It is appreciated that some components (e.g., a comparator) of the absolute value measurement module 304 and the DC load regulation measurement module 306 may be shared between the two modules.

Figure 4:
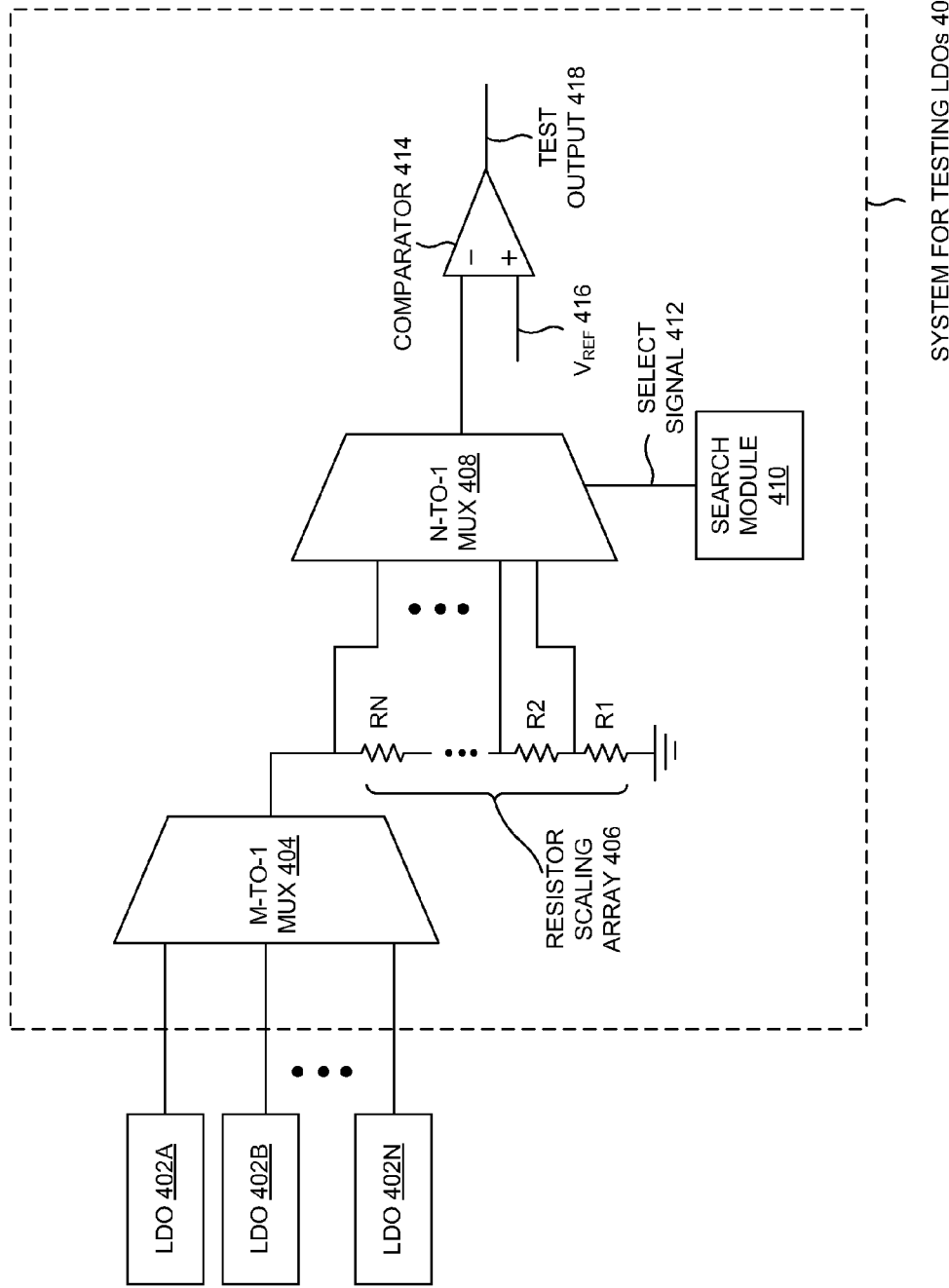
FIG. 4 is a schematic diagram of an exemplary system for testing LDO regulators, according to one embodiment.

FIG. 4 is a schematic diagram of an exemplary system for testing LDO regulators 400, according to one embodiment. It is appreciated that the exemplary system for testing LDO regulators 400 may be implemented as the absolute measurement module 304 of FIG. 3. In one embodiment, the system for testing LDO regulators 400 comprises LDO regulators 402A through 402N, an M-to-1 multiplexer (MUX) 404, a resistor scaling array 406, an N-to-1 multiplexer 408, a search module 410, and a comparator 414. As illustrated in FIG. 4, the M-to-1 multiplexer 404, which is coupled to outputs of the LDO regulators 402A through 402N, selects one of the LDO regulators for testing. The selection of the LDO regulators for testing is determined by a select signal to the M-to-1 MUX 404. In one embodiment, the M-to-1 MUX 404 forwards the output voltage (e.g., which ranges between 1.2 volts and 1.4 volts) of the LDO regulator selected by multiplexing respective outputs of the LDO regulators based on the select signal.

In one exemplary implementation, the resistor scaling array 406 generates multiple candidate voltages by dividing the output voltage of the selected LDO regulator. As illustrated in FIG. 4, one end of the resistor scaling array 406 is connected to ground, whereas the other end is connected to the output of the M-to-1 MUX 404. In one embodiment, the resistor scaling array 406 is used to adjust the output voltage of the selected LDO regulator (e.g., which ranges between 1.2 volts and 1.4 volts) to a level of reference voltage $V_{REF}$ 416 (e.g., which is approximately 0.7 volt). In one embodiment, the resistor scaling array 406 (e.g., a resistor divider, a voltage divider, etc.) generates multiple candidate voltages by tapping corresponding node voltages formed by the number of resistors forming the resistor scaling array 406.

Furthermore, the N-to-1 MUX 408 selects and forwards one of the candidate voltages based on a select signal 412 forwarded from the search module 410. In one embodiment, the search module 410 is based on a binary search algorithm which speeds up the process of finding a particular one of the candidate voltages which matches the reference voltage 416. In one embodiment, the search module 410 is controlled by a digital logic which executes the binary search algorithm.

In one embodiment, the comparator 414 generates a test output 418 by comparing the selected candidate voltage with the reference voltage $V_{REF}$ 416. In one embodiment, the candidate voltage selected by the N-to-1 MUX 408 is applied to the negative input of the comparator 414, and the reference voltage $V_{REF}$ 416 is applied to the positive input of the comparator 414. If the candidate voltage does not match the reference voltage $V_{REF}$ 416, the search module 410 enables the N-to-1 MUX 408 to select another candidate voltage and repeats the comparison. In one embodiment, the reference voltage $V_{REF}$ 416 is forwarded from an external test device. It is appreciated that a test output 418 generated by the comparator 414 is a logical zero if the candidate voltage is greater than the external reference voltage $V_{REF}$ 416. Conversely, the comparator 414 generates the test output 418 as logical one if the candidate voltage is less than the external reference voltage $V_{REF}$ 416.

In one embodiment, the candidate voltage corresponding to the logical zero is decoded to obtain the value of the LDO regulator output selected for testing (e.g., before the output voltage was adjusted by the resistor scaling array 406). In one embodiment, the value of the output voltage is stored in a register to be read out by the external test device. It is appreciated that the value of the LDO regulator output is an absolute value measurement of the output voltage. It is further appreciated that the comparator 414 is a high gain comparator with an offset cancellation scheme. One skilled in the art will appreciate that offset in the system is cancelled using the in-built offset cancellation scheme which eliminates the requirement for calibration to cancel the offset.

Figure 5:
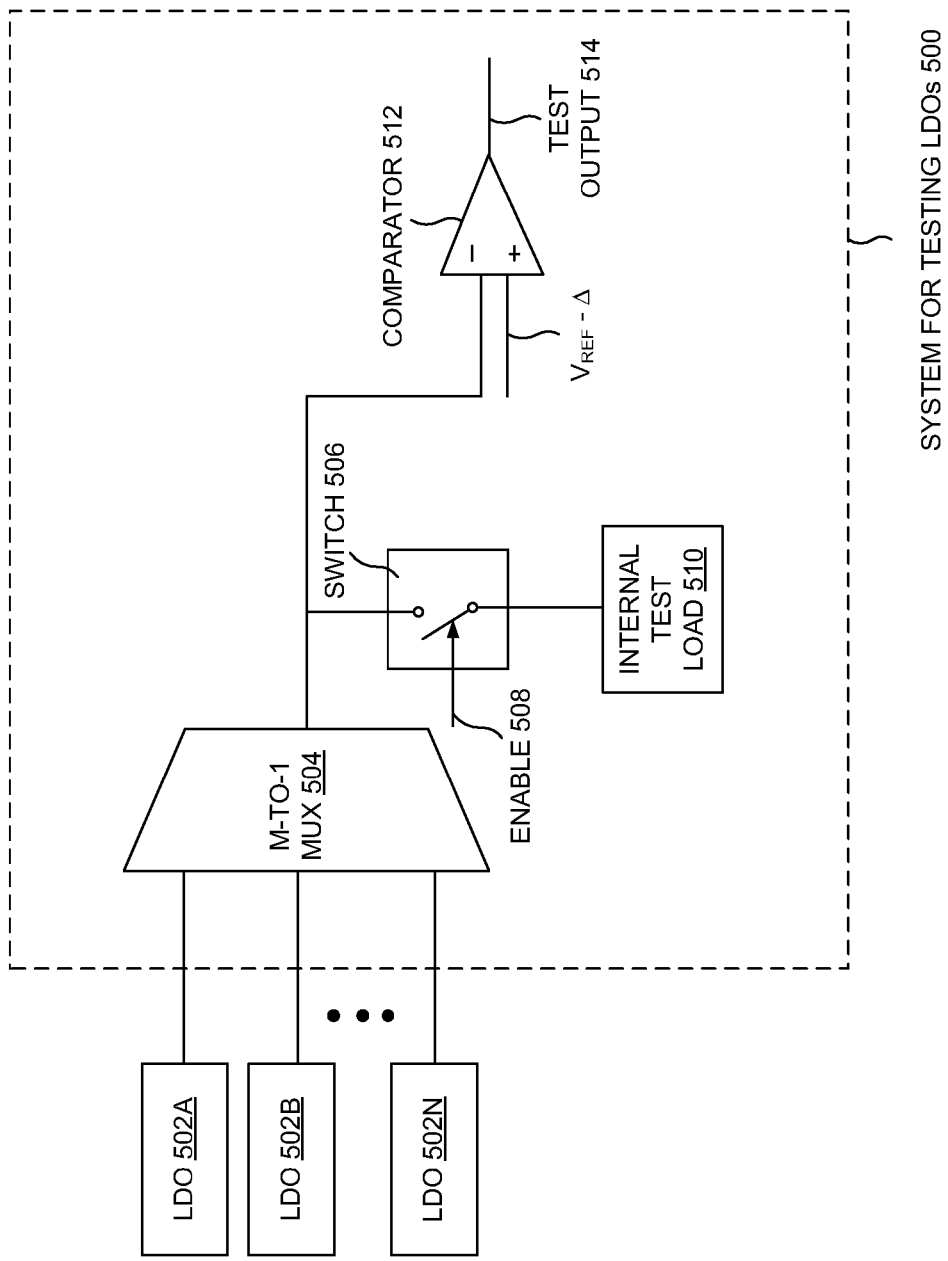
FIG. 5 is a schematic diagram of an exemplary system for testing LDO regulators, according to one embodiment.

FIG. 5 is a schematic diagram of an exemplary system for testing LDO regulators 500, according to one embodiment. It is appreciated that the exemplary system for testing LDO regulators 500 may be implemented as the DC load regulation measurement module 306 of FIG. 3. In one embodiment, the system for testing LDO regulator 500 comprises an M-to-1 MUX 504, a switch 506, an internal test load 510, and a comparator 512.

As illustrated in FIG. 5, output voltage terminals of LDO regulators 502A through 502N are connected to the M-to-1 MUX 504. In one embodiment, the M-to-1 MUX 504 forwards output voltage of the selected LDO regulator by multiplexing respective output voltages of the LDO regulators 502A through 502N based on a selection signal processed by the M-to-1 MUX 504. In one embodiment, the output voltage of the LDO regulator selected for testing ranges between 1.2 volts and 1.4 volts.

In one embodiment, the switch 506 is used to apply the internal test load 510 to the selected LDO output voltage. In one exemplary implementation, the switch 506 is closed for testing if a signal enabling the switch (e.g., an enable 508) is applied to the switch 506. In one embodiment, the internal test load 510 is applied to draw specific amount of current from the LDO regulator output, where the specific current can be controlled from a temperature compensated bias current using mirroring techniques. In one exemplary implementation, the output voltage of the selected LDO regulator modified (e.g., subtracted) by the internal test load 510 is applied to the negative input of the comparator 512 while the reference voltage (e.g., $V_{REF}$-$\Delta$), is provided to the positive input of the comparator 512. It is appreciated that the reference voltage is equivalent to a bandgap reference voltage associated with the LDO regulators 502A through 502N. It is also appreciated that $\Delta$ (delta) indicates a threshold voltage (e.g., the test limit)

In one exemplary implementation, the value of $\Delta$ is approximately 10 milli-volts. In one embodiment, the value of threshold voltage or $\Delta$ can be set to a desired value (e.g., the test limit). It is also appreciated that the value of the reference voltage, which is associated with the bandgap reference, is approximately 0.7 volt. In one embodiment, the comparator 512 generates a test output 514 by comparing the reference voltage with the output voltage of the selected LDO regulator modified by the internal test load 510. It is appreciated that the test output 514 generated by the comparator 512 is a logical zero if the output voltage of the selected LDO regulator modified by the internal test load 510 is greater than the reference voltage. In other words, this may be the case when the DC load regulation measurement or voltage is within the threshold voltage. It is appreciated that the logical zero indicates a DC load regulation measurement of the selected LDO regulator for testing is within the threshold voltage.

Conversely, the test output 514 generated by the comparator 512 is a logical one if the output voltage of the selected LDO regulator modified by the internal test load 510 is less than the reference voltage. In other words, this may be the case where the DC load regulation measurement exceeds the threshold voltage. Consequently, the logical one as the test output 514 indicates that the selected LDO regulator has failed the test since the DC load regulation measurement is not within the threshold value.

Figure 6A:
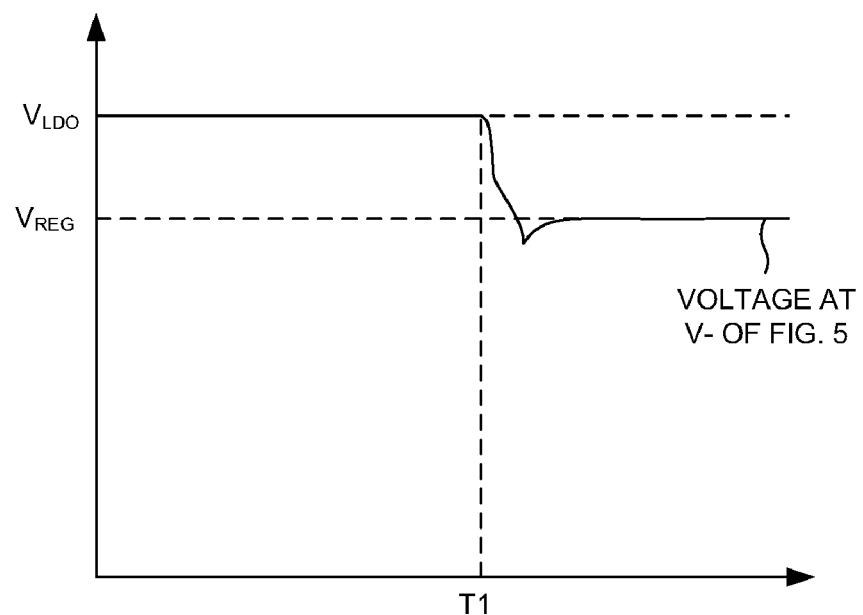
FIGS. 6A and 6B are exemplary graphs illustrating the measurement of DC load regulation using the system described in FIG. 5, according one embodiment.
Figure 6B:
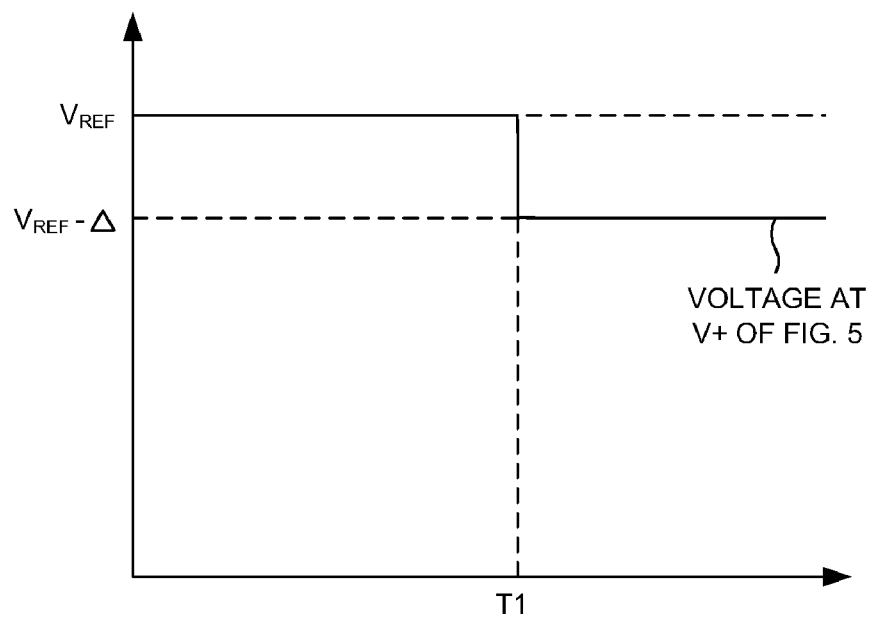

FIGS. 6A and 6B are exemplary graphs illustrating measurement of the DC load regulation using the system described in FIG. 5, according one embodiment. Particularly, FIG. 6A illustrates the LDO regulator output voltage with no test load before the test is performed at T1 and the LDO regulator output voltage modified by the internal test load after T1. It is appreciated that FIG. 6A illustrates the DC load regulation measured starting from T1 and onward when the internal test load 510 of FIG. 5 is applied to the LDO output voltage. A drift in the LDO regulator output occurs when the internal test load 510 is enabled through a digital control signal (e.g., the enable 508). FIG. 6A illustrates that the LDO output voltage (e.g., from one of the LDO regulators 502A through 502N) drops if specific amount of current is drawn from the LDO regulator output by applying the internal test load 510 at T1 when the testing for DC load regulation starts.

FIG. 6B illustrates a reference voltage, which is $V_{REF}$ modified by a threshold voltage $\Delta$, according to one embodiment. Particularly, FIG. 6B illustrates the reference voltage (e.g., $V_{REF}$-$\Delta$) applied to the comparator 512 of FIG. 5 as the internal test load 510 is applied to the LDO regulator output. In one embodiment, the reference voltage is applied to the positive input of the comparator 512 at the time of testing while the LDO regulator output voltage modified by the internal test load 510 is applied to the negative input of the comparator 512.

In one embodiment, the devices, systems and/or BIST schemes of the present invention facilitate DC load regulation measurement of each output of LDO regulators as well as its absolute value measurement. It is appreciated that the devices, systems and/or BIST schemes can be implemented in an electronic device and system which includes a system on chip (SOC) with LDO regulators and other types of microelectronic circuit devices. In one exemplary implementation, the DC load regulation measurement can be detected looking at a chip input current profile during the test. Furthermore, in one embodiment, the devices, systems and/or BIST schemes eliminate the calibration requirement to remove offset in the system by using an in-built offset cancellation scheme. In addition, the embodiment further reduces the test time by using a binary search algorithm in fixing correct trim bit (e.g., see the resistor scaling array 406 of FIG. 4).

In one exemplary implementation, it may take approximately 3.75 ms for testing 20 LDO regulators using the above described BIST scheme, systems or device equipped with 32 KHz clock (e.g., or any other faster clock can be used to improve speed). In one embodiment, devices, systems and/or BIST schemes eliminate the requirement of an extra pin (e.g., for calibration or other necessities) as the external reference is multiplexed with a functional analog pin. In addition, in this scheme, area overhead required for testing the LDO regulators is significantly reduced. Furthermore, it is appreciated that time required for data transfer between the chip being tested and its tester is also reduced significantly.

Although the present embodiments have been described with reference to specific example embodiments, it will be evident that various modifications and changes may be made to these embodiments without departing from the broader spirit and scope of the various embodiments. For example, the various devices, modules, analyzers, generators, etc. described herein may be enabled and operated using hardware circuitry (e.g., CMOS based logic circuitry), firmware, software and/or any combination of hardware, firmware, and/or software (e.g., embodied in a machine readable medium). For example, the various electrical structure and methods may be embodied using transistors, logic gates, and electrical circuits (e.g., application specific integrated ASIC circuitry).

What is claimed is:

1. A system for testing low dropout regulators, comprising:
    a resistor scaling array for generating a plurality of candidate voltages based on an output voltage of the low dropout regulators;
    a multiplexer for forwarding one of the plurality of candidate voltages based on a select signal from a search module; and
    a comparator for generating a test output by comparing the one of the plurality of candidate voltages with an external reference voltage.

2. The system of claim 1, wherein the comparator comprises a high gain comparator with an offset cancellation scheme.

3. The system of claim 1, further comprising another multiplexer for forwarding the output voltage of the low dropout regulators by multiplexing respective output voltages of the low dropout regulators.

4. The system of claim 1, wherein the search module is based on a binary search algorithm.

5. The system of claim 1, wherein the external reference voltage is forwarded from an external test device.

6. The system of claim 1, wherein the external reference voltage is approximately 0.7 volt.

7. The system of claim 1, wherein the test output generated is a logical zero if the one of the plurality of candidate voltages is greater than the external reference voltage.

8. The system of claim 7, wherein the one of the plurality of the candidate voltages corresponding to the logical zero is decoded to obtain a value of the output voltage of the low dropout regulators.

9. The system of claim 8, wherein the value of the output voltage of the low dropout regulators is stored in a register to be read out by an external test device.

10. The system of claim 8, wherein the value of the output voltage of the low dropout regulators is an absolute value measurement of the output voltage of the low dropout regulators.

11. A system for testing low dropout regulators, comprising:
    a switch for applying an internal test load to an output voltage of the low dropout regulators; and
    a comparator for generating a test output by comparing a reference voltage with the output voltage of the low dropout regulators modified by the internal test load.

12. The system of claim 11, wherein the output voltage of the low dropout regulators ranges between 1.2 volts and 1.4 volts.

13. The system of claim 11, further comprising a multiplexer for forwarding the output voltage of the low dropout regulators by multiplexing respective output voltages of the low dropout regulators.

14. The system of claim 11, wherein the test output generated is a logical zero if the output voltage of the low dropout regulators modified by the internal test load is greater than the reference voltage.

15. The system of claim 14, wherein the reference voltage is equivalent to a bandgap reference voltage associated with the low dropout regulators reduced by a threshold voltage.

16. The system of claim 14, wherein the logical zero indicates that a DC load regulation measurement of a low dropout regulator corresponding to the output voltage is within the threshold voltage.

17. A device for testing low dropout regulators, comprising:
    an absolute value measurement module for measuring absolute output voltages of the low dropout regulators, the module comprising:
        a resistor scaling array for generating a plurality of candidate voltages based on a first output voltage of the low dropout regulators;
        a multiplexer for forwarding one of the plurality of candidate voltages selected by a binary search algorithm; and
        a first comparator for generating a first test output by comparing the one of the plurality of candidate voltages with an external reference voltage; and
    a DC load regulation measurement module for measuring corresponding DC regulation voltages of the low dropout regulators, the module comprising:
        a switch for applying an internal test load to a second output voltage of the low dropout regulators; and
        a second comparator for generating a second test output by comparing a reference voltage with the second output voltage modified by the internal test load.

18. The device of claim 17, wherein the first comparator and the second comparator are implemented using a single comparator in a sequential manner.

19. The device of claim 17, further comprising a digital configuration circuit for setting a test mode for the absolute value measurement module or the DC load regulation measurement module.

20. The device of claim 19, wherein the test mode is triggered by a signal from an external test device.

* * * * *